US010724962B2

United States Patent
Logothetidis

(10) Patent No.: US 10,724,962 B2
(45) Date of Patent: Jul. 28, 2020

(54) METHOD FOR IN-LINE DETERMINATION OF FILM THICKNESS AND QUALITY DURING PRINTING PROCESSES FOR THE PRODUCTION OF ORGANIC ELECTRONICS

(75) Inventor: Stergios Logothetidis, Salonika (GR)

(73) Assignees: Aristotle University of Thessaloniki—Research Committee, Salonika (GR); Stergios Logothetidis, Salonika (GR)

( * ) Notice: Subject to any disclaimer, the term of this patent is extended or adjusted under 35 U.S.C. 154(b) by 947 days.

(21) Appl. No.: 14/113,125

(22) PCT Filed: Apr. 21, 2011

(86) PCT No.: PCT/GR2011/000018
§ 371 (c)(1),
(2), (4) Date: Oct. 21, 2013

(87) PCT Pub. No.: WO2012/143742
PCT Pub. Date: Oct. 26, 2012

(65) Prior Publication Data
US 2014/0039822 A1 Feb. 6, 2014

(51) Int. Cl.
*G01N 21/88* (2006.01)
*H01L 51/00* (2006.01)
*G01N 21/21* (2006.01)

(52) U.S. Cl.
CPC ....... *G01N 21/8851* (2013.01); *G01N 21/211* (2013.01); *H01L 51/0004* (2013.01);
(Continued)

(58) Field of Classification Search
CPC .................................................. C07C 247/16
(Continued)

(56) References Cited

U.S. PATENT DOCUMENTS

| 5,874,747 A * | 2/1999 | Redwing ............... H01L 33/007 257/103 |
| 6,052,188 A * | 4/2000 | Fluckiger .................. G01J 4/04 356/369 |

(Continued)

FOREIGN PATENT DOCUMENTS

WO WO-2010128395 A1 * 11/2010 ........... G01N 21/211

OTHER PUBLICATIONS

Lotz et.al., Industrial Inline Control for Advanced Vacuum Roll to Roll Systems, 2007.*

(Continued)

*Primary Examiner* — Lina M Cordero
(74) *Attorney, Agent, or Firm* — James Creighton Wray

(57) ABSTRACT

The present invention is related to the in-line determination of thickness, optical properties and quality of thin films and multilayer structures of organic (conductors, semiconductors and insulators), hybrid (organic/inorganic) and inorganic (e.g. metals, oxides) materials in real-time by the use of Spectroscopic Ellipsometry—SE, during their printing and/or treating by roll-to-roll and sheet-to-sheet processes. SE unit is located on a stage with the possibility of movement in the lateral direction in relation to the movement of e.g. the roll, taking measurements in the spectral range of Vis-fUV from 1.5-6.5 eV. The method can be used in-line to monitor and control in real-time the printing and surface or bulk treatment processes on flexible rolls or sheets both along and across the web or sheet, in the air or in an environment of nitrogen or other gas, resulting in the production of flexible organic and printed electronic devices such as organic photovoltaics, organic light-emitting diodes etc with controlled and tailored functional properties.

10 Claims, 9 Drawing Sheets

(52) U.S. Cl.
CPC .. *G01N 2021/213* (2013.01); *H01L 2251/558* (2013.01); *Y02E 10/549* (2013.01); *Y02P 70/521* (2015.11)

(58) Field of Classification Search
USPC ............ 702/19, 27, 40, 81, 84, 150; 438/99; 356/369; 313/504; 257/103
See application file for complete search history.

(56) References Cited

U.S. PATENT DOCUMENTS

| | | | | |
|---|---|---|---|---|
| 6,091,382 | A * | 7/2000 | Shioya | G09G 3/3216 313/504 |
| 6,798,513 | B2 * | 9/2004 | Abraham | G01F 23/284 356/369 |
| 6,804,003 | B1 * | 10/2004 | Wang | G01B 11/0641 356/369 |
| 7,746,471 | B1 * | 6/2010 | Johs | G01N 21/21 356/369 |
| 7,777,882 | B2 * | 8/2010 | Logothetidis | G01B 11/0641 356/369 |
| 8,339,603 | B1 * | 12/2012 | Liphardt | G01N 21/211 356/369 |
| 8,860,023 | B2 * | 10/2014 | Tsubuku | H01L 29/66969 257/268 |
| 2004/0257567 | A1 * | 12/2004 | Woollam | G01N 21/211 356/369 |
| 2007/0134420 | A1 * | 6/2007 | Koberstein | A61L 27/34 427/258 |
| 2007/0172978 | A1 * | 7/2007 | Chua | C07C 247/16 438/99 |
| 2009/0103092 | A1 * | 4/2009 | Logothetidis | G01B 11/0641 356/369 |
| 2013/0140605 | A1 * | 6/2013 | Ramdani | H01L 21/28264 257/192 |

OTHER PUBLICATIONS

Losurdo et. Al., Spectroscopic ellipsometry and polarimetry for materials and systems analysis at the nanometer scale: state-of-the-art, potential, and perspectives, 2009.*

D'Elia et al., "Ellipsometry investigation of the effects of annealing temperature on the optical properties of indium tin oxide thin films studied by Drude-Lorentz model", Applied Surface Science, 255(16), 2009, pp. 7203-7211.*

Jin et al., Imaging ellipsometry revisited: Developments for visualization of thin transparent layers on silicon substrates, 1996.*

Horiba, Spectroscopic Ellipsometry—Tauc-Lorentz Dispersion Formula, Technical Note, 2006.*

E Langereis et al., "In situ spectroscopic ellipsometry as a versatile tool for studying atomic layer deposition", 2009 J. Phys. D: Appl. Phys. 42 073001.*

Horiba, Uvisel Spectroscopic Phase Modulated Ellipsonneter—Thin Films, Surface and Interface Characterization (Year: 2008).*

* cited by examiner

METHOD FOR IN-LINE DETERMINATION OF FILM THICKNESS AND QUALITY DURING PRINTING PROCESSES FOR THE PRODUCTION OF ORGANIC ELECTRONICS

FIELD OF THE INVENTION

The present invention relates to a method for the in-line determination of thickness, optical properties and quality of thin films and multilayer films, particularly during printing processes for organic electronics production.

TECHNOLOGICAL BACKGROUND

In industry, there is a strong necessity for process monitoring and in-line control for the minimization of time needed for production and quality control as well as for the reduction of production failures, losses and cost. The existing technology for process monitoring enables the in-situ determination of thickness and the optical properties mostly of inorganic coatings grown on stationary substrates by vacuum techniques such as evaporation as well as the ex-situ determination of properties of composite materials after the production and in small pieces. [1-13] Moreover, these methods include static measurements without the capability of monitoring in-line the quality of the grown coatings across the substrate and eventually of patterned films. Finally, none of the existing methods have been used or tested under conditions that characterize the industrial scale such as the dimensions of the substrates, the deposition time, the speed etc. [1-13]

The lack of monitoring and control systems in-line during the printing and treatment processes leads to limited production line performance since only the control of the final product takes place. This is very important since thin film processes are comprised of several stages, such as surface functionalization, printing of organic, hybrid and inorganic materials, that define the quality of the final product. In addition, thin films and multilayer properties are related to several physical parameters that have to be thoroughly controlled during the production.

AIM OF THE INVENTION

This invention aims at remedying the drawbacks set out above.

SUMMARY OF THE INVENTION

To solve this problem, there is proposed this invention which lies on the determination of thickness, optical properties and quality of thin films and multilayer structures of organic such as conductive and semi-conductive polymers, hybrid such as composite organic/inorganic materials and inorganic such as metal-based materials, oxides materials, in-line and in real-time during their printing and patterning by the use of lab- and large-scale processes such as roll-to-roll (R2R) and/or sheet-to-sheet (S2S).

According to a particular embodiment of the invention, monitoring of the various processes is obtained by the use of Spectroscopic Ellipsometry (SE) with measurements in the spectral region of Visible to far UltraViolet (Vis-FUV) (1.5-6.5).

Also, this method determines the properties of the surface treatment and activation of polymer substrates and the drying, heating and laser treatment of the printed thin films in order to enhance the adhesion of printed material and improve their performance, respectively. The configuration of the method is such that simulate the industrial conditions of processing. Therefore it can be used for the monitoring and control of various R2R and S2S printing processes and processes for surface treatment in air, nitrogen or other gas atmosphere for all type of materials that are printed or coated sequentially for the development of flexible organic and printed electronic devices with desired properties. SE includes several advantages that prove its capability for quick and reliable process monitoring. SE is a non-destructive optical technique that is based on the measurement of the change of the light polarization state and provides information for the optical, and not only, materials' properties. SE can be used for the in-line monitoring along and across the web during the R2R and S2S printing processes of organic, hybrid and inorganic thin films, for the determination of the mechanisms taking place during the printing and the monitoring of the optical properties and quality of materials in real-time. Furthermore, it is able to determine their thickness and to control the uniformity of the printed materials and thickness and to correlate the materials' thickness and properties with the printing conditions.

By the in-line SE, the determination of the thickness and optical parameters of organic, hybrid and inorganic thin film materials, related to their quality, is feasible. In particular, optical quantities of materials such as the energy in which the maximum electronic absorption takes place i.e. the mean Gap or Penn Gap ($E_0$) and/or the energy position where the threshold of electronic absorption occurs i.e. the fundamental optical energy gap ($E_g$) can be determined during printing and treatment processes and are directly related to the identity and quality of the materials.

SE offers real-time data feedback as fast as 90 ms which enables the precise scanning of the printed and/or treated areas of the web even when high processing speeds are applied.

Methods for the monitoring and control in the production of flexible organic and printed electronic materials and devices by R2R and S2S printing of organic, hybrid and inorganic thin films with priority to the properties of the surfaces, interfaces e.g. organic/organic, organic/inorganic or hybrid/organic and thin films (single and multilayer) that are related to the functional properties of the intermediate and final products are not available and do not represent existing technologies. By the described technology, the quality control of the product is transferred within the production stages towards the improvement of its efficiency and performance.

Therefore, an appropriate, fast, smart and reliable monitoring and control process during the production should: (a) control the technical requirements for the printed materials e.g. appropriate thickness, good adhesion to the substrate, (b) keep the cost of combined processes low, (c) save on materials and energy, (d) reduce the time of process control and production and (e) promote the standardization of the processes.

Further features and properties of the method according to the invention are defined in the appended sub-claims respectively.

In the following, a detailed description of a way of carrying out the invention, with the use of examples, explaining the application of the invention is presented, which is illustrated by appended drawings related to the invention.

DESCRIPTION

A detailed description of a way of carrying out the invention, with the use of examples is presented hereinafter.

First of all, it is described the method for acquiring SE spectra in-line and real-time within the time range of ms for the case of the following examples:

a) Printing or coating of thin films (or layers) of the organic material PEDOT:PSS (Poly(3,4-ethylenedioxythiophene) poly(styrenesulfonate) on roll of flexible polymeric substrate of Poly(Ethylene Terephthalate) (PET) and of flexible substrate of hybrid barrier/$SiO_x$/PET by gravure printing and other printing and coating techniques;

b) Printing of films of hybrid high barrier material in various printing conditions;

c) Printing of films of P3HT:PCBM polymer blend on roll of flexible substrate PEDOT:PSS/PET and d) surface treatment and activation of PET by corona treatment.

This method can be generally applied in the case of monolayer and multilayer thin films of organic, hybrid and/or inorganic materials with conductive, semiconductive and/or insulating properties that can be used for the production of flexible organic and printed electronic devices such as flexible organic photovoltaics and flexible organic light emitting diodes. These materials are used as barrier materials, electrodes, electron donors and acceptor, emitters and absorbers of light and can be printed/coated by various printing and coating techniques such as gravure, screen, ink-jet, slot-die and/or patterned by e.g. laser. Moreover, it can be applied for all polymeric substrates such as Poly(Ethylene Terephthalate) (PET), Poly(Ethylene Naphthalate) (PEN), Poly(Ethylene Sulfate) (PES), PolyCarbonate (PC), and other flexible substrates such as metal foils, glass, textiles, paper. Furthermore, it can be applied for all kinds of surface and bulk treatments such as corona, UV, oxygen plasma, and thermal and laser treatment. The above can be applied in large-area substrates in the form of rolls or sheets through R2R and S2S processes.

The realization of measurements in such a short time (ms) is appropriate for the in-line control of thin films that are developed by R2R and S2S processes where high rolling speeds are applied, e.g. printing of PEDOT:PSS and organic semiconducting thin films on PET substrates.

The experimental unit for the in-line monitoring process of thickness and optical properties in real-time during the printing processes of organic, hybrid and inorganic materials on flexible substrates and the surface treatment as described above is detailed below. The in-line and real-time measurements realized for the presentation and the use of the proposed technique is set out below.

Figure 1:
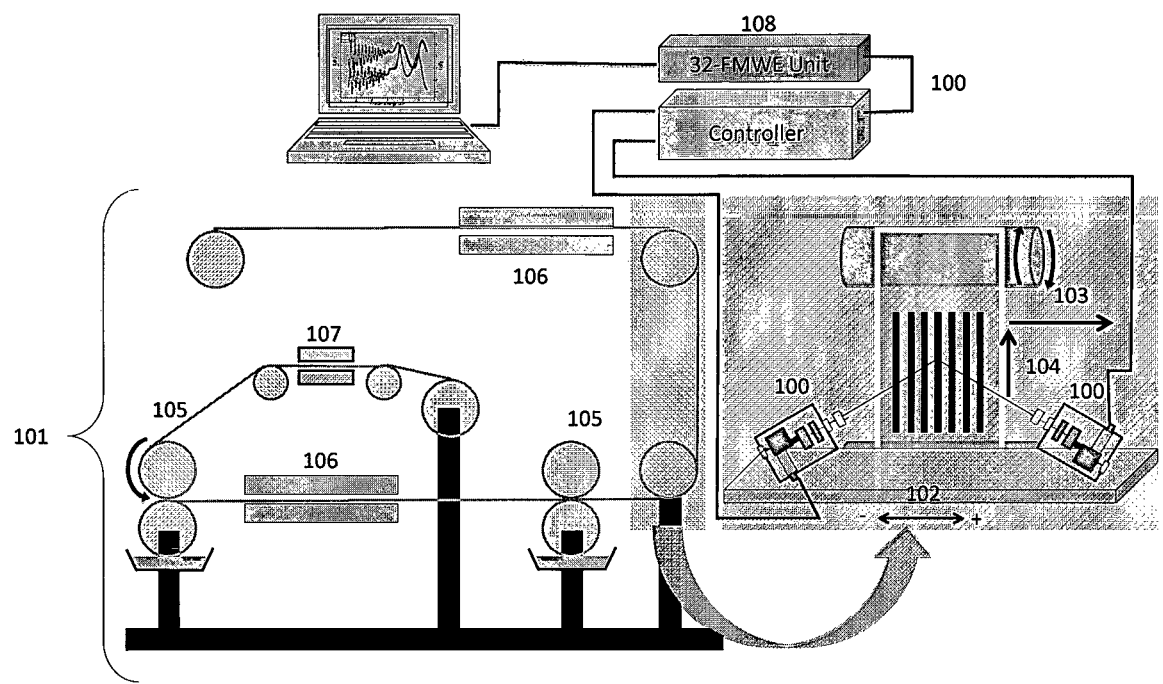
FIG. 1 is a schematic representation of the Spectroscopic Ellipsometry (SE) unit placed on a moving stage and adapted on a R2R printing system wherein the R2R system includes several printing and treating stations T.

FIG. 1 shows Spectroscopic Ellipsometry (SE) measurements in the spectral region of Vis-FUV that realised with a Fast MultiWavelength Ellipsometer (FMWE) unit 100. The unit is adapted on a pilot R2R printing system 101 where the angle of incidence is 70°. Other angles, lower or higher, from 60-75° can also be used. The SE unit is placed on a moving stage 102 and has the capability for movement in the lateral 103 direction in relation to the direction of the web 104. In the R2R printing system, several gravure printing stations 105 and dryers 106 as well as corona treatment station 107 are included. The configuration, adjustment and placement of the SE unit enable the monitoring of the successive printing and treatment processes, either when these are being combined or not.

The realization of the measurements in the spectral region of Vis-FUV is applied for the study of the material's optical properties that are related to the electronic transmissions, their electronic structure and their thickness and thickness homogeneity. The real-time measurement is performed with the simultaneous acquisition of 32 different wavelengths with 32 simultaneously measured data points, that cover the energy range of 1.5-6.5 eV 108. The upper energy limit of SE spectra acquisition with the use of FMWE is 6.5 eV (190 nm) with which the control of the polymeric membranes' and printed organic, hybrid and inorganic thin films' optical properties can be performed. The lower energy limit is 1.5 eV [6, 7, 12, 14].

Moreover, the roll speeds used are compatible with those used in industrial scale. Therefore the process can be applied for the in-line control in large or industrial scale R2R production processes.

The parameterization and analysis of the measured pseudo-dielectric function $<\in(E)>=<\in_1(E)>+i<\in_2(E)>$ are performed with the use of a geometrical model consisted of air/thin film(s)/polymeric substrate in which the determination of the optical properties of each phase has been realized with the modified Tauc-Lorentz (TL) model [1, 2, 6, 12, 14].

In the case where the surface treatment of the polymeric substrate is measured, the thin film represents the modified layer. In the TL model, the imaginary part $\in_2(E)$ of the dielectric function is determined by multiplying the Tauc density of states with the $\in_2$ that results from the Lorentz oscillator model. Therefore, said TL model provides the capability of determining the fundamental optical gap $E_g$ of the interband transitions, the energy $E_0$, the broadening C and the strength A of each oscillator. The $E_0$ of this model is correlated to the known Penn gap, the energy position where the strong electronic absorption of the material takes place. The imaginary part $\in_2(E)$ of the TL oscillator is given by the following relations: [1,8]

$$\varepsilon_g(E) = \frac{AE_0C(E-E_g)^2}{(E^2-E_0^2)^2+C^2E^2} \cdot \frac{1}{E}, E > E_g \quad (1)$$

$$\varepsilon_g(E) = 0, E \le E_g, \quad (2)$$

and the real part $\in_1(E)$ is determined by Kramers-Kronig integration, by the relation:

$$\varepsilon_1(E) = \varepsilon_\infty + \frac{2}{\pi} P \int_{E_g}^{\infty} \frac{\xi \varepsilon_2(\xi)}{\xi^2 - E^2} d\xi. \quad (3)$$

The basic information deduced by SE measurements/analyses concerns the film thickness, and the optical parameters and constants, which are strongly related to the films' quality and their suitability to be used in flexible organic electronic devices.

More specifically, the following magnitudes can be calculated:
the energy where the maximum electronic absorption of organic, hybrid and inorganic materials takes place, namely the Penn Gap, $E_0$;
the fundamental band gap $E_g$ that is an important parameter, since it defines the suitability of the material to be used in the development of e.g. flexible organic photovoltaics and flexible organic light emitting diodes;
the damping factor of the absorption peak attributed to electronic absorption; the broadening C;
the strength of the absorption peak A;
the $\in_\infty$ that measures the material's strength and accounts the contribution of the electronic transitions not taken into account in the modeling analysis, because they occur at high energies well above the experimental measured energy range, otherwise it is equal to unity.

The use of the suitable theoretical model air/thin film(s)/polymeric substrate for the analysis of the SE spectra, that is deduced during the printing or treatment process, provides the capability of determination of the thickness of the organic, hybrid, inorganic film. With this analysis, the stability and the effectiveness of the printing and treatment process can be monitored and evaluated.

Figure 2:
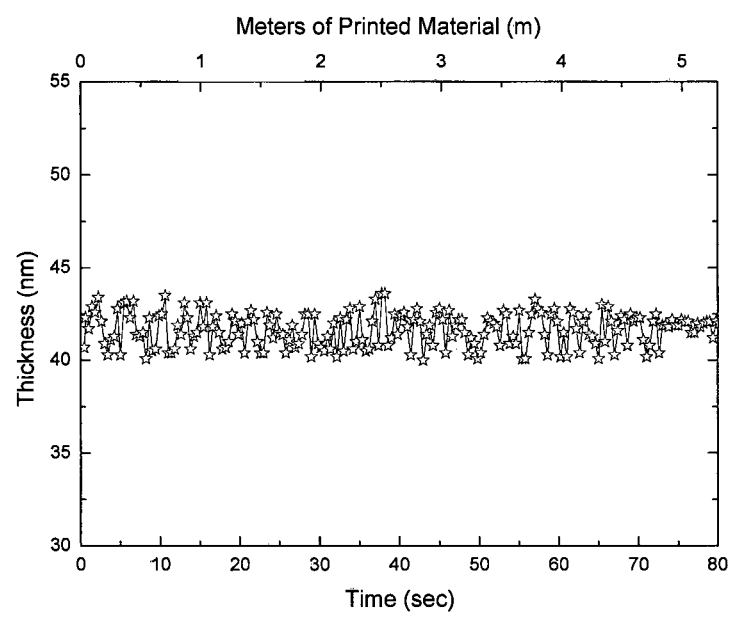
FIG. 2 shows a monitoring of PEDOT:PSS thin film thickness homogeneity during its printing on PET by R2R gravure in continuous stripes form, wherein bottom x axis shows the time of printing layer while top x axis shows the length of the printed web. The results were obtained through the in-line and real-time analysis of the measured SE spectra taken by the FWME unit along the printed line.
Figure 3:
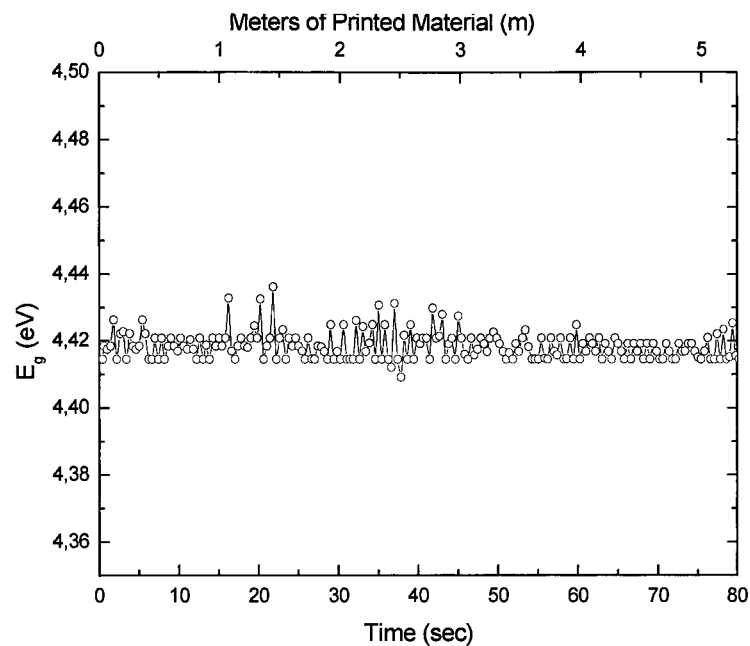
FIG. 3 shows a monitoring of the stability of the PEDOT:PSS fundamental gap $E_g$ during its printing on PET by R2R gravure in continuous stripes form, wherein bottom x axis shows the time of printing, while top x axis shows the length of the printed web. The results were obtained through the in-line and real-time analysis of the measured SE spectra taken by the FWME unit along the printed line.
Figure 4:
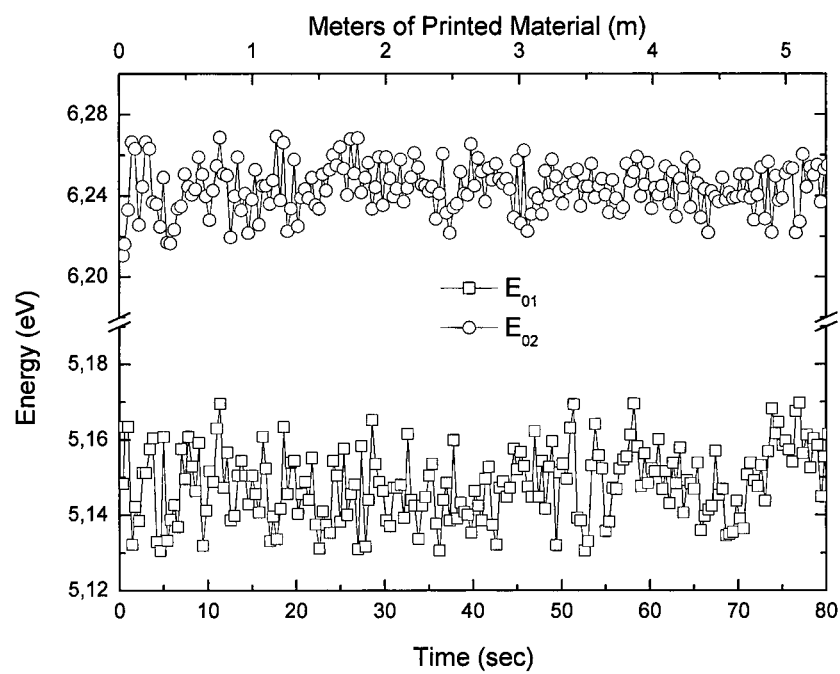
FIG. 4 shows a monitoring of the stability of the PEDOT:PSS through the two Penn gap $E_{01}$ and $E_{02}$ parameters during its printing on PET by R2R gravure in continuous stripes form, wherein bottom x axis shows the time of printing while top x axis shows the length of the printed web. The results were obtained through the in-line and real-time analysis of the measured SE spectra taken by the FWME unit along the printed line.

FIGS. 2, 3 and 4 show the in-line monitoring and control of the thickness and the optical properties in real-time during the printing of PEDOT:PSS thin films on PET substrate by R2R gravure. The duration of printing process was 80 s and for the real-time SE measurements the Sampling Time, i.e. time between two sequential measurements was ST=200 ms.

Figure 5:
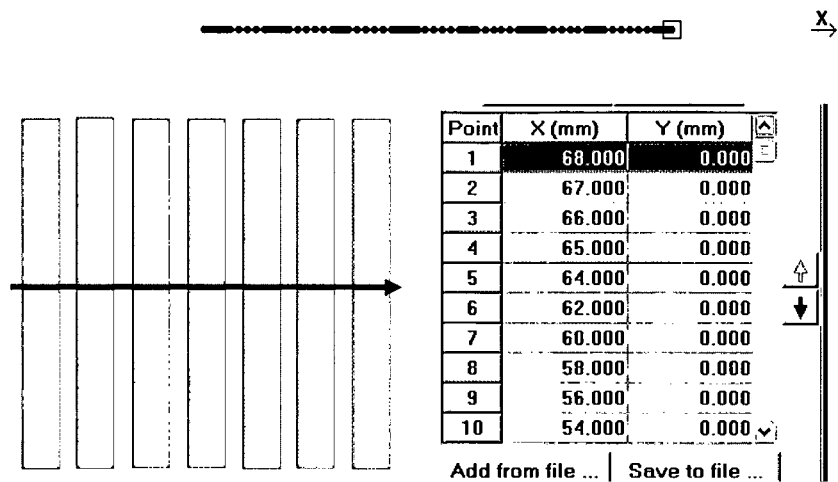
FIG. 5 is a schematic representation of the grid designed for the real-time measurement and calculation of the thickness of the R2R gravure printed PEDOT:PSS stripes on PET in the lateral direction.
Figure 6:
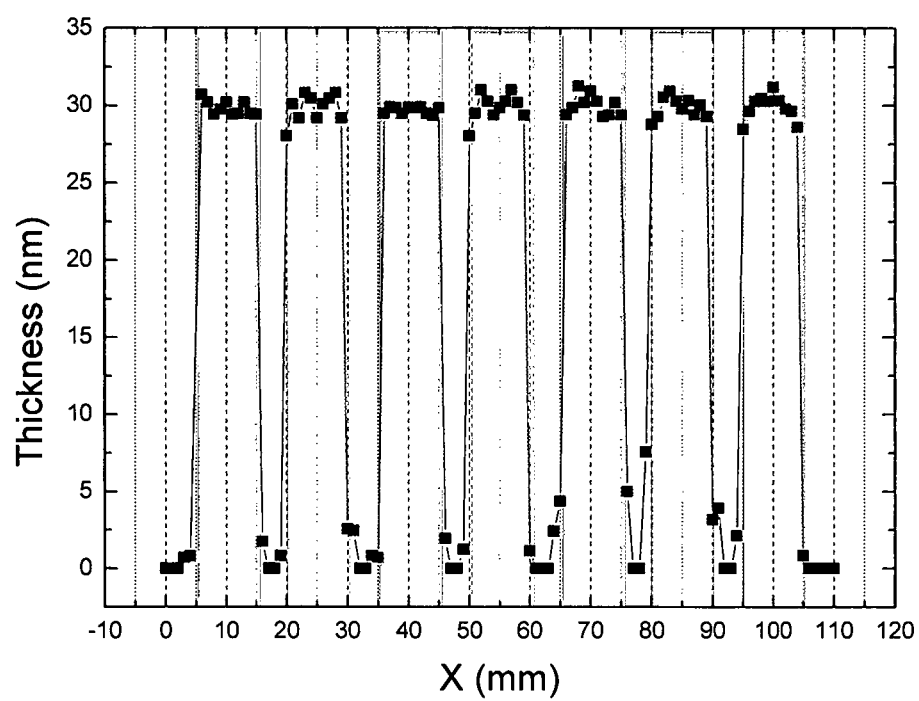
FIG. 6 represents a measurement and calculation of the thickness and homogeneity of the R2R gravure printed PEDOT:PSS stripes in the lateral direction, wherein close-to-zero thickness points correspond to measurements of the substrate.
Figure 7:
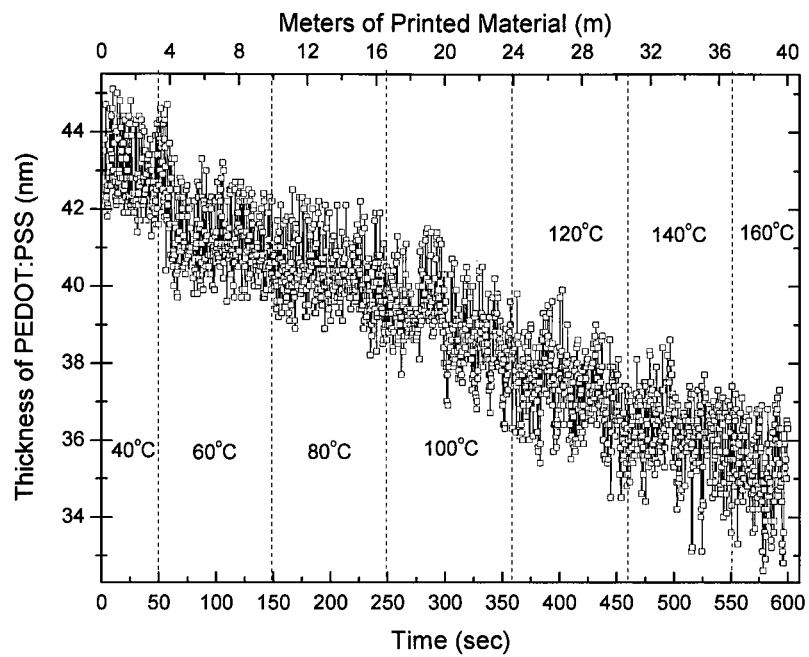
FIG. 7 shows the variation of the thickness of the R2R gravure printed PEDOT:PSS stripes, according to the corresponding drying temperature applied, wherein bottom x axis shows the time of printing while top x axis shows the length of the printed web. The results were obtained through the in-line and real-time analysis of the measured SE spectra taken by the FWME unit along the printed lines.

FIGS. 5 and 6 show an example of monitoring and control of thickness of printed PEDOT:PSS thin films on PET in the lateral direction in relation to the movement of the web. This operation offers the in-line verification of the stability and effectiveness of the printing process. In more detail, FIG. 6 shows the representation of the grid designed in order to meet the requirements of the sample and the pattern of the printing cylinder. Since the size and distance on the grid are specified by the user, there is the opportunity to study and examine all kinds of patterns and materials. FIG. 7 shows the variation of PEDOT:PSS thin film thickness during its printing on PET by R2R gravure across the web. The results verified the printing of a uniform thin film in the x-axis. Also, the close-to-zero thickness points correspond to the measurement of the substrate and demonstrate the capability of the technique to monitor variations in the thickness of the material.

FIG. 7 shows an example of variation of thickness with the time for various drying temperatures of the printed PEDOT:PSS film. The increase of the drying temperature induces a reduction of the film thicknesses.

The data provided by the analysis of the SE measurements in-line and in real-time is very crucial in industrial scale, since the monitoring and analysis of very small thickness changes enables the precise optimization, calibration and "standardization" of the process.

Figure 8:
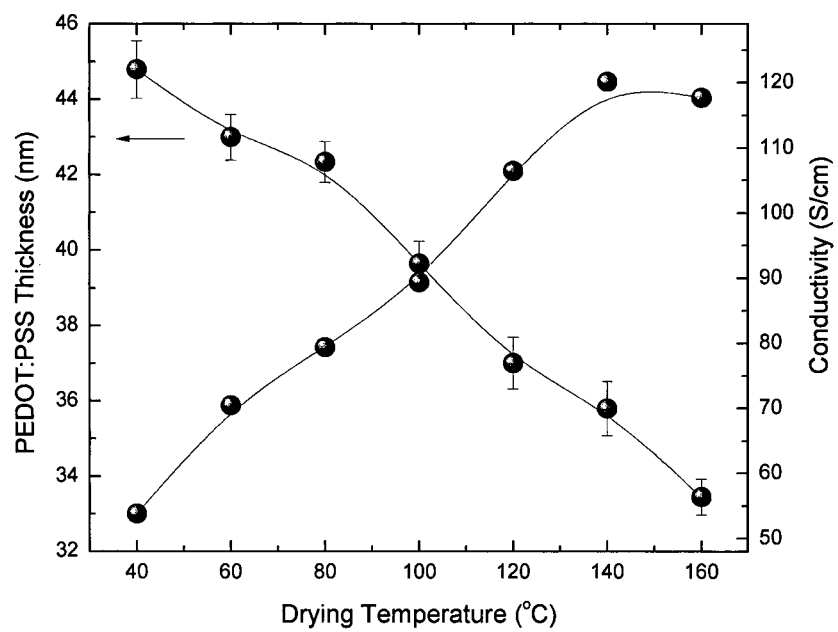
FIG. 8 shows the correlation of the PEDOT:PSS thickness and measured conductivity with the applied drying temperature.

Also, the technique allows the correlation of the printing conditions with the thickness and the optical as well as the functional properties of the materials. For example, FIG. 8 shows the correlation of PEDOT:PSS thin film thickness with drying temperature after printing and the measured electrical conductivity. From Drawing 8 it can be concluded that the increase of drying temperature induces a reduction of film thickness and an increase of electrical conductivity. The optimum value of conductivity was found to correspond to drying temperature of 140° C.

Figure 9:
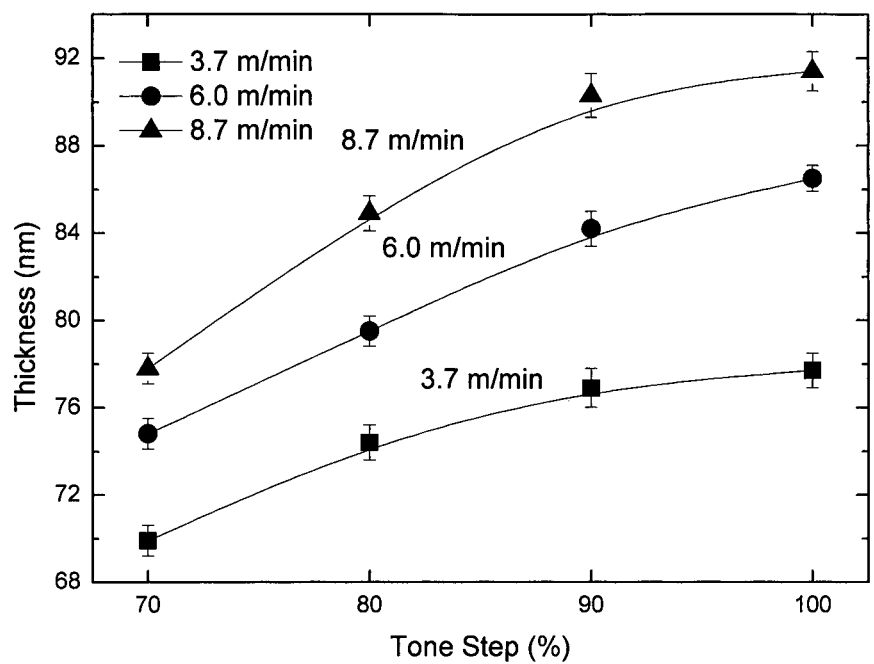
FIG. 9 shows the correlation of the P3HT:PCBM polymer blend thin film thickness, printed on PEDOT:PSS/PET, with the web speed and the tone step of the engraved cells of the patterned cylinder.

In addition, the technique has the capability to determine the thickness of materials that are used as semiconducting layers in organic photovoltaics and to correlate the printing conditions with the thickness of the material. The thickness of the active material is an important parameter for the performance and the efficiency of the organic photovoltaic. FIG. 9 correlates the thickness of the P3HT:PCBM polymer blend, printed on PEDOT:PSS/PET, with the speed of the web and the tone step of the printing cylinder. The increase of the tone step value from 70 to 100% indicates the proportional increase in the volume of the engraved cells (from 6.7 to 10.7 $cm^3/cm^2$) of the printing cylinder. From FIG. 9 it can be concluded that the increase of the tone step leads to the increase of P3HT:PCBM thickness independently of the web speed applied. Moreover, the increase of the web speed leads to thicker but less uniform films. The results show that the optimum conditions for printing the P3HT:PCBM blend include web speed of 3.7 m/min and tone step of 100%.

Figure 10:
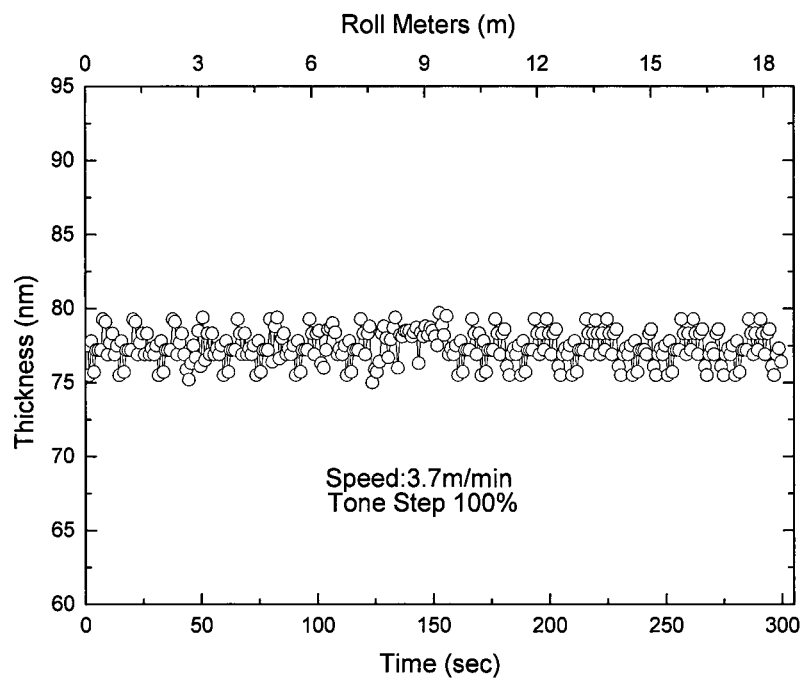
FIG. 10 shows the monitoring of the P3HT:PCBM polymer blend thin film thickness homogeneity during its printing on PEDOT:PSS/PET by R2R gravure in continuous stripes form, wherein bottom x axis shows the time of printing while top x axis shows the length of the printed web. The results were obtained through the real-time analysis of the measured SE spectra taken by the FWME unit along the printed surface.

FIG. 10 shows the in-line and real-time control of the thickness and the optical properties of P3HT:PCBM blend during its printing on PEDOT:PSS/PET. The duration of printing process was 300 s and for the real-time SE measurements the Sampling Time was ST=300 ms.

Figure 11:
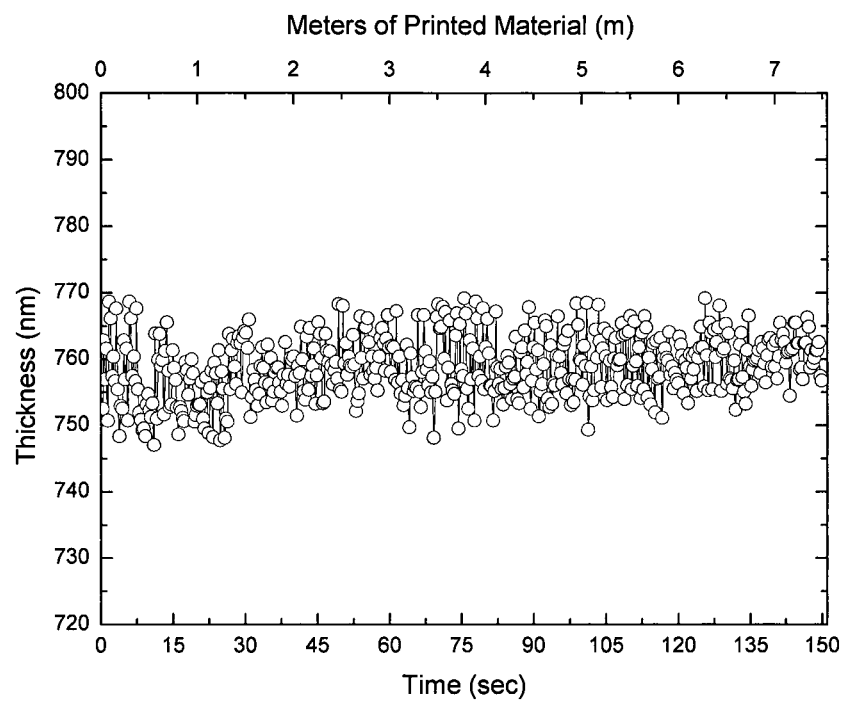
FIG. 11 shows a monitoring of the hybrid (organic/inorganic) polymer barrier material thickness homogeneity during its printing on $SiO_x$/PET by R2R gravure, wherein bottom x axis shows the time of printing while top x axis shows the length of the printed web. The results were obtained through the in-line and real-time analysis of the measured SE spectra taken by the FWME unit along the printed surface.
Figure 12:
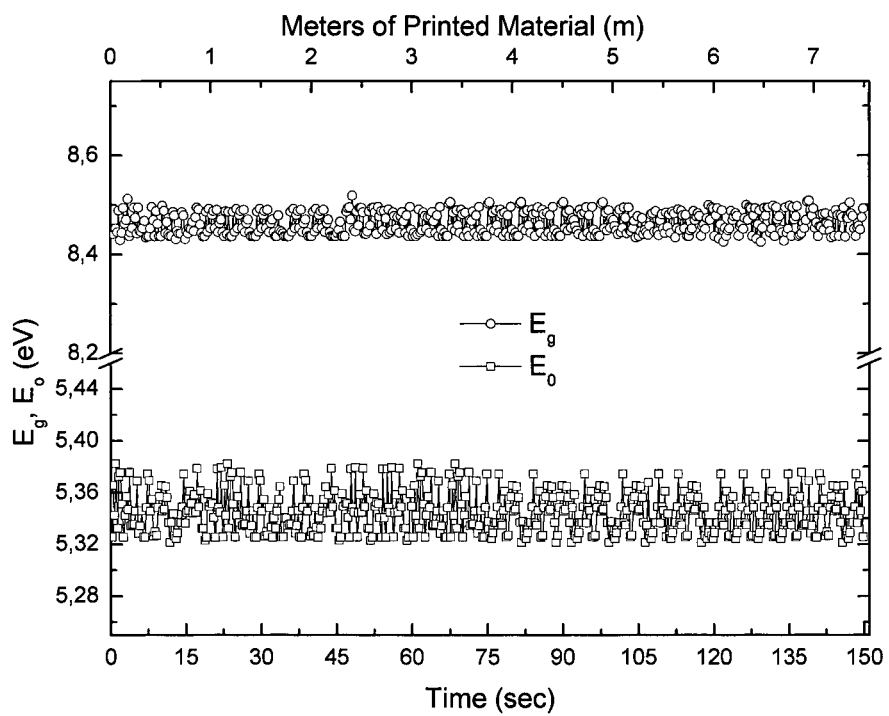
FIG. 12 shows a monitoring of the stability of the hybrid polymer barrier material fundamental gap $E_g$ and Penn gap $E_0$ values during its printing on $SiO_x$/PET by R2R gravure printing, wherein bottom x axis shows the time of printing while top x axis shows the length of the printed web. The results were obtained through the in-line and real-time analysis of the measured SE spectra taken by the FWME unit along the printed surface.

FIGS. 11 and 12 show the in-line and real-time control of the thickness and the optical properties of hybrid polymer barrier material during its printing on $SiO_x$/PET. The duration of printing process was 150 s and for the real-time SE measurements the Sampling Time was ST=100 ms.

By the analysis of the SE spectra with the Eqs (1)-(3) in combination with the model air/thin film(s)/polymeric substrate, the thickness as well as the optical parameters such as $E_g$ and $E_{0x}$ can be determined. From the results it can be concluded that the printing of homogeneous films is performed in all cases without the presence of failure or variation in thickness and materials properties. The information provided from the in-line monitoring and analysis is particularly important for industrial-scale processes.

Figure 13:
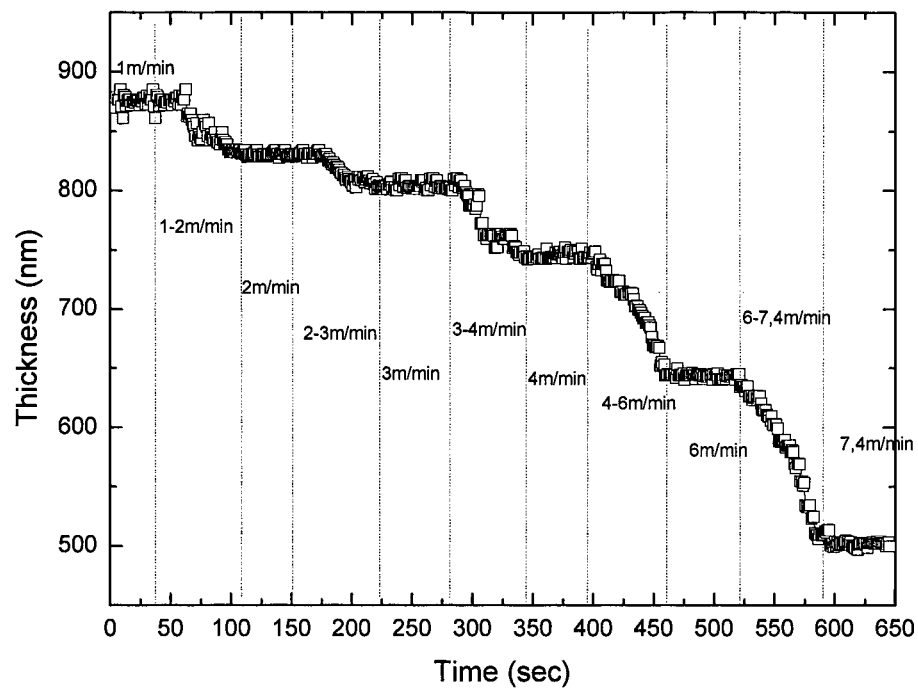
FIG. 13 represents the variation of the thickness of R2R gravure printed hybrid polymer barrier material, according to the corresponding speed of the web. X-axis shows the time of the printing process, wherein the results were obtained through the in-line and real-time analysis of the measured SE spectra taken by the FWME unit along the printed surface.
Figure 14:
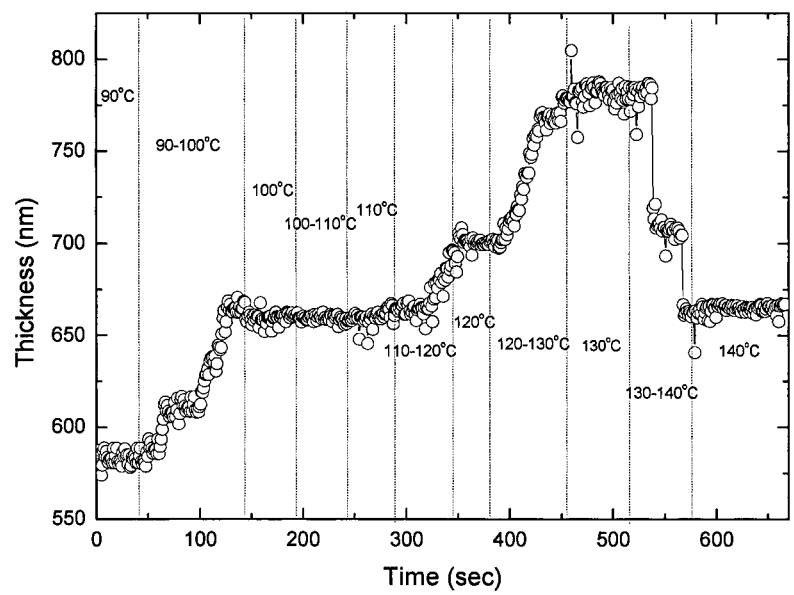
FIG. 14 represents the variation of the thickness of R2R gravure printed hybrid polymer barrier material, according to the corresponding drying temperature applied. X-axis shows the time of the printing process, wherein the results were obtained through the in-line and real-time analysis of the measured SE spectra taken by the FWME unit along the printed surface.

FIGS. 13 and 14 show an example of variation of thickness of the hybrid polymer material with time for various web speeds and various drying/curing temperatures, respectively. The change of the web speed affects the thickness of the film. The increase of web speed, which indirectly causes a reduction in drying/curing time, induces a gradual reduction of thickness. Moreover, increase of drying temperature up to 130° C. leads to the increase of the thickness due to the more intense cross-linking of the material.

Figure 15:
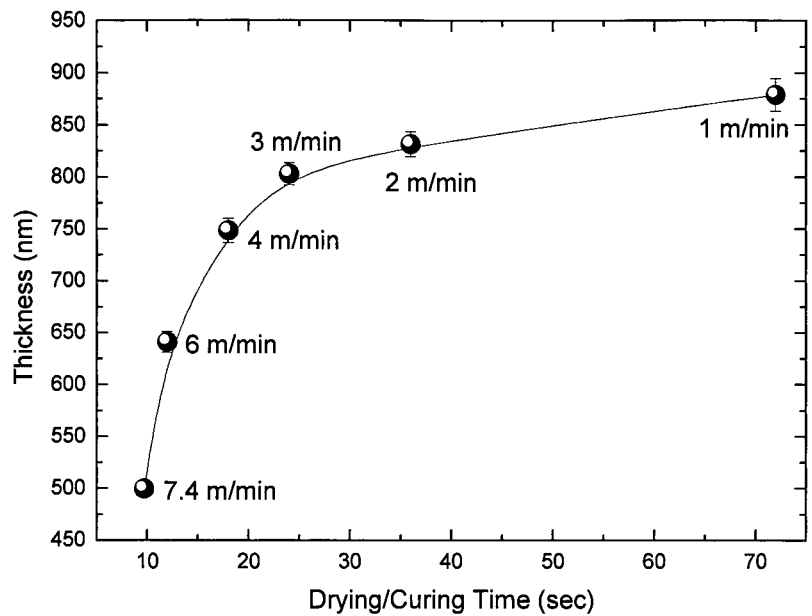
FIG. 15 shows the correlation of the thickness of gravure printed hybrid polymer barrier material with the web speed and drying time, calculated by the in-line and real-time analysis of the measured SE spectra taken by the FWME unit.

Also, the technique allows the correlation of printing conditions with the thickness of the material. FIG. 15 shows the correlation between the thickness of the hybrid barrier material with the web speed and the duration of the drying/curing process.

Figure 16:
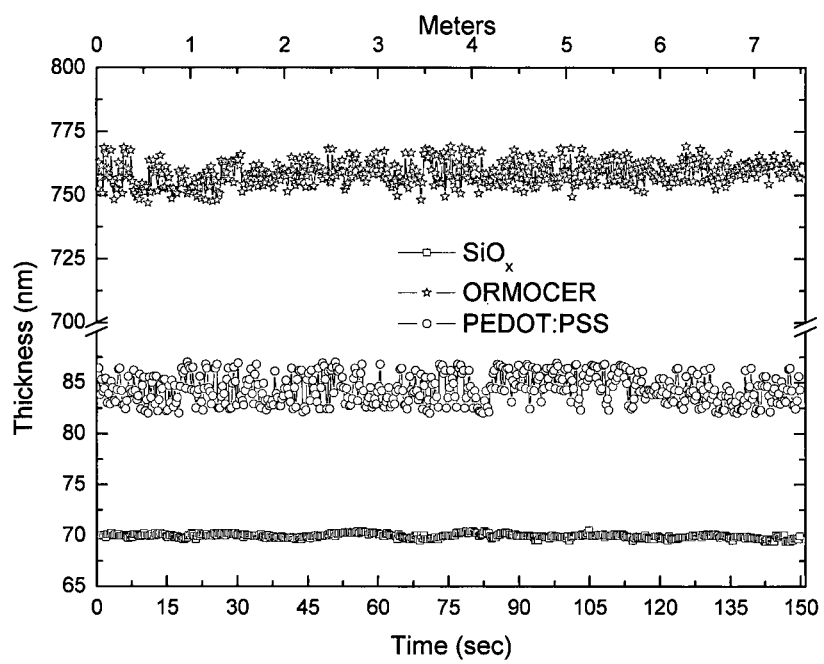
FIG. 16 shows the monitoring of PEDOT:PSS thin film thickness homogeneity during its printing on hybrid/SiOx/PET by R2R gravure printing and simultaneous monitoring of the thickness of hybrid barrier layer and the inorganic SiOx layer, wherein the cycles correspond to PEDOT:PSS thickness values, the triangles to hybrid barrier material and the squares to $SiO_x$. Bottom x axis shows the time of printing while top x axis shows the length of the printed web. The results were obtained through the in-line and real-time analysis of the measured SE spectra taken by the FWME unit for each layer along the coated/printed surface.

FIG. 16 shows the in-line monitoring PEDOT:PSS film thickness printed on hybrid/$SiO_x$/PET by R2R gravure. Before the printing of the PEDOT:PSS, the printing of hybrid barrier material onto $SiO_x$/PET flexible substrate was obtained. The technique allows the simultaneous monitoring of multilayer structures of organic, hybrid and inorganic materials and their combination. This operation is very important in industrial scale since it offers the possibility to monitor the thickness of the printed layers and the quality of single and/or multilayer structures and the definition of failures or defects, either in upper or in any other layer of the structure independently of the type, or the structure of the material.

Figure 17:
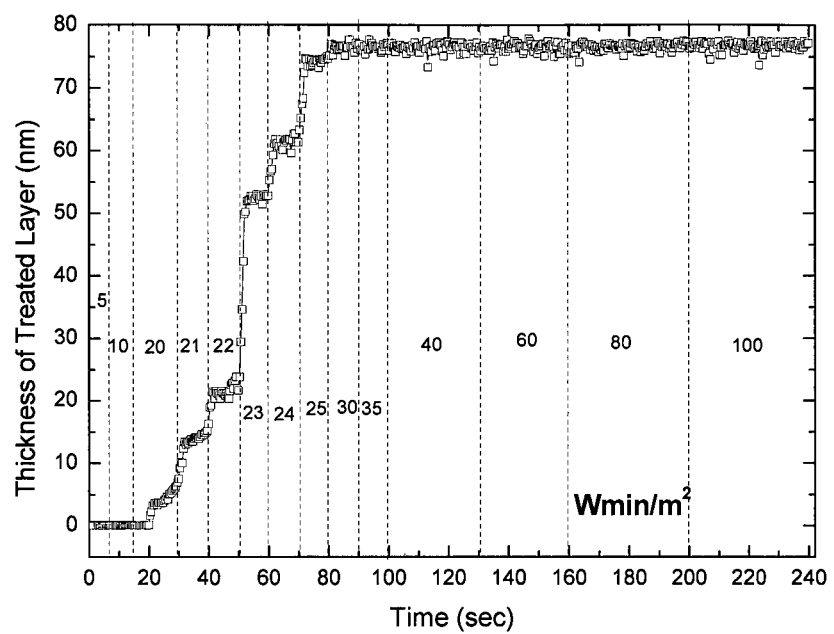
FIG. 17 represents the variation of thickness of the surface modified layer of PET web for various values of the applied power of the corona treatment, wherein Bottom x axis shows the time of the corona treatment while top x axis shows the length of the treated web. The results were obtained through the in-line and real-time analysis of the measured SE spectra taken by the FWME unit along the treated surface.

FIG. 17 shows the variation of thickness of the surface treated layer of PET web during its surface treatment by corona for various power values. By the use of this process it is possible to determine the optimum value of the applied power and thus to achieve the optimum value of the free surface energy of the substrate and finally to optimize the quality of adhesion of the printed material on substrate's surface.

In conclusion, the in-line determination of the thickness, optical properties, uniformity and homogeneity of the printed layers are very important and result to the direct determination of the quality and the final functional properties of the R2R or S2S printed systems organic and/or hybrid and/or inorganic multilayer thin films deposited on flexible substrates both in the form of rolls or sheets and devices. Also, in-line monitoring enables the standardization of the processes which is not possible by the use of other techniques.

Moreover, with this methodology, the tuning and adjustment of the experimental conditions and the optimum printing of materials on rolls or sheets of polymeric or other flexible substrates with the desirable functional properties, essentially for flexible organic and printed electronics applications, are feasible. The in-line feedback on the materials properties during their printing enables the modification of the properties by changing the printing conditions. This is very important in industry since this kind of adjustments determine the properties and functionality of the final product. Especially, in the case of large-scale R2R and S2S printing processes, for the development of flexible electronic devices, the use of in-line technology that allows the in-line and real-time monitoring of printing processes, creates a novel framework for quality control during all the production stages.

REFERENCES

[1] "THIN FILMS HANDBOOK: Processing, Characterization and Properties" in *"In-situ monitoring in thin films during growth with spectroscopic ellipsometry"*

S. Logothetidis, ed. by Hari Singh Nalwa (Academic Press, 2001).

[2] U.S. Pat. No. 7,777,882,
"Method for the in-situ and real-time determination of the thickness, optical properties and quality of transparent coatings during their growth onto polymeric substrates and determination of the modification, activation and the modification depth of polymeric materials surfaces"
Logothetidis Stergios

[3] "Substrate treatment and drying conditions effect on the properties of roll-to-roll gravure printed PEDOT:PSS thin films"
C. Koidis, S. Logothetidis, C. Kapnopoulos, P. G. Karagiannidis, A. Laskarakis, and N. A. Hastas
C. Koidis, et al., Mater. Sci. Eng. B (2011), doi:10.1016/j.mseb.2011.03.007

[4] "Optical properties of hybrid polymers as barrier materials"
D. Georgiou, A. Laskarakis, S. Logothetidis, S. Amberg-Scwhab, U. Weber, M. Schmidt, K. Noller
Applied Surface Science 255, 8023-8029 (2009).

[5] "Study of the optical response of hybrid polymers with embedded inorganic nanoparticles for encapsulation of flexible organic electronics"
A. Laskarakis, D. Georgiou, S. Logothetidis, S. Amberg-Scwhab, U. Weber
Materials Chemistry and Physics 115, 269-274 (2009).

[6] "In-situ and real-time investigation of ZnO thin films growth onto rigid and flexible substrates"
C. Koidis, S. Logothetidis, D. Georgiou, and A. Laskarakis
Phys. Stat. Sol. (c) 5, No. 5, 1366-1369 (2008).

[7] "Real-time optical modelling and investigation of inorganic nano-layer growth onto flexible polymeric substrates"
A. Laskarakis, D. Georgiou, S. Logothetidis
Materials Science and Engineering B 166, 7-13 (2010).

[8] "Real-time studies during coating and post-deposition annealing in organic semiconductors"
M. Campoy-Quiles, M. Schmidt, D. Nassyrov, O. Peña, A. R. Goñi, M. I. Alonso, M. Garriga
Thin Solid Films 519, 2678-2681 (2011).

[9] "Real-time measurement of photo-induced effects in 9,10-*phenanthrenequinone-doped poly(methyl methacrylate) photopolymer by phase-modulated ellipsometry"
C.-I. Chuang, Y.-N. Hsiao, S.-H. Lin b, Y.-F. Chao
Optics Communications 283, 3279-3283 (2010).

[10] "Real time analysis of amorphous and microcrystalline silicon®lm growth by multichannel ellipsometry"
R. W. Collins, Joohyun Koh, A. S. Ferlauto, P. I. Rovira, Yeeheng Lee, R. J. Koval, C. R. Wronski
Thin Solid Films 364, 129-137 (2000).

[11] "Application of real-time spectroscopic ellipsometry for characterizing the structure and optical properties of microcrystalline component layers of amorphous semiconductor solar cells"
Joohyun Koh, H. Fujiwara, C. R. Wronski, R. W. Collins
Solar Energy Materials and Solar Cells 49, 135-142 (1997).

[12] "HANDBOOK OF NANOPHYSICS: Principles and Methods" in "Nanometrology"
S. Logothetidis, ed. by Klaus D. Sattler (CRF Press, 2011).

[13] "Real-Time Investigation of Crystallization and Phase-Segregation Dynamics in P3HT:PCBM Solar Cells During Thermal Annealing"
T. Agostinelli, S. Lilliu, J. G. Labram, M. Campoy-Quiles, M. Hampton, E. Pires, J. Rawle, O. Bikondoa, D. D. C. Bradley, T. D. Anthopoulos, J. Nelson, J. E. Macdonald
Advanced Functional Materials, (2011), in press

[14] "Parameterization of the optical functions of amorphous materials in the interband region"
G. E. Jellison, and F. A. Modine
Appl. Phys. Lett. 69, 371 (1996).

The invention claimed is:

1. A method for in-line determination of thickness, optical properties and quality of thin films and multilayer films, comprising:
monitoring organic, hybrid and inorganic materials or their combination during their Roll-to-Roll (R2R) and Sheet-to-Sheet (S2S) printing and/or coating and/or patterning processes on polymeric and other flexible substrates for production of organic and printed electronics, in particular organic photovoltaics and organic light emitting diodes, further comprising:
providing a monitoring device in-line, and
configuring the monitoring device to perform the steps consisting of:
(a) covering an energy range within a spectral region visible to far ultraviolet and making simultaneous measurements by moving the monitoring device in-line with respect to the substrate during the printing, and/or coating and/or patterning process;
(b) collecting data in-line and in real-time from the simultaneous measurements in a set of at least 32 different wavelengths that cover a determined energy range within a 190-830 nm range, and that represent acquisition of dielectric function spectra, the collection being performed in a range of milliseconds as short as 90 ms with the monitoring device in-line and transmitting collected data to a processor;
(c) parameterizing and analysing the data including the measured dielectric function with the processor by inputting a geometrical model representing air/thin film(s)/polymeric substrate, extending along a respective web for determining the thickness, optical properties and the quality of printed organic(s) or blended organic materials and/or hybrid and/or inorganic film(s);
(d) determining the thickness, optical properties and quality of said organic, hybrid and inorganic materials in both lateral and longitudinal directions in relation to a direction of the respective web ensuring quality control of the printed material throughout the web and independently of a complexity of the printed pattern applied;
(e) calculating energy gaps that are related to the optical properties and quality of thin films and to their suitability for required applications, in particular Fundamental Energy Gap $E_g$ and Penn gap or mean gap $E_0$.

2. Method according to claim 1, characterized in that the said steps are carried out in the specified order (a) to (e) respectively.

3. Method according to claim 1, characterized in that said measurements are realized with a Fast Multiwavelength Ellipsometer (FMWE) unit that is ergonomically adapted in a R2R or S2S printing system where an angle of incidence is between 60-75°, and wherein the FMWE unit is movable in-line in a lateral direction in relation to a direction of the web.

4. Method according to claim 1, characterized in that the in-line calculation of the thickness and optical properties and/or the control of quality are conducted by Spectroscopic Ellipsometry, in particular by means of a Spectroscopic Ellipsometer.

5. Method according to claim 1, characterized in that the optical properties of each layer or film are calculated by using a modified Tauc-Lorentz model (TL).

6. Method according to claim 1, characterized in that it determines and calculates the thickness, optical constants and the optical properties of organic materials such as conductors, semiconductors and insulators hybrid materials such as semiconductors and insulators and inorganic materials such as conductors and semiconductors applied in flexible organic and printed electronics.

7. Method according to claim 1, characterized in that the thickness and the optical properties are correlated with the printing, coating and patterning conditions of the materials and their final functional properties including their efficiency, barrier properties, and electrical conductivity.

8. Method according to claim 1, characterized in that the thickness and the optical properties of 1) a surface layer that is formed by a corona and/or UV (Ultra-Violet) treatment of the polymeric and coated polymeric substrates and of
2) a dried and/or thermally treated and/or laser treated printed layers, both in air or in other atmosphere are determined.

9. Method according to claim 8, characterized in that the corresponding treatment processing efficiency comprising the substrate's surface activation efficiency and the quality of treating of the printed layers is evaluated based upon said thickness and optical property determination of said layers respectively.

10. Use of the method as defined in claim 1, for the monitoring and process and quality control in production of flexible organic and printed electronic devices ensuring the quality, reliability and cost-efficiency of final products.

* * * * *